US009785032B2

(12) United States Patent
Chiang et al.

(10) Patent No.: US 9,785,032 B2
(45) Date of Patent: *Oct. 10, 2017

(54) ACTIVE DEVICE ARRAY SUBSTRATE AND DISPLAY PANEL

(71) Applicant: E Ink Holdings Inc., Hsinchu (TW)

(72) Inventors: Ming-Sheng Chiang, Hsinchu (TW); Chi-Ming Wu, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/927,498

(22) Filed: Oct. 30, 2015

(65) Prior Publication Data

US 2016/0054636 A1 Feb. 25, 2016

Related U.S. Application Data

(63) Continuation-in-part of application No. 14/301,346, filed on Jun. 11, 2014, now Pat. No. 9,312,284.

(30) Foreign Application Priority Data

Nov. 12, 2013 (TW) .............................. 102141090 A
Nov. 14, 2014 (TW) .............................. 103139596 A

(51) Int. Cl.
*G02F 1/167* (2006.01)
*H01L 27/12* (2006.01)
(Continued)

(52) U.S. Cl.
CPC .............. *G02F 1/167* (2013.01); *G02B 1/14* (2015.01); *G02F 1/1341* (2013.01); *H01L 25/18* (2013.01);
(Continued)

(58) Field of Classification Search
CPC ...... G02F 1/167; G02F 1/1339; G02F 1/1341; G02F 2001/13456; G02F 1/1313;
(Continued)

(56) References Cited

U.S. PATENT DOCUMENTS

| 5,153,986 A | 10/1992 | Brauer et al. |
| 6,448,953 B1 | 9/2002 | Murade |

(Continued)

FOREIGN PATENT DOCUMENTS

| CN | 101191929 | 6/2008 |
| CN | 101673020 | 3/2010 |

(Continued)

OTHER PUBLICATIONS

"Notice of Allowance of US co-pending Application, U.S. Appl. No. 14/301,346", issued on Jan. 21, 2016, p. 1-p. 29, in which the listed references were cited.

(Continued)

*Primary Examiner* — Victoria K Hall
(74) *Attorney, Agent, or Firm* — Jianq Chyun IP Office

(57) ABSTRACT

A display panel includes a display panel body, a first protective film, a second protective film, and a sealant. The display panel body has a first surface, a second surface opposite to the first surface, and a first through hole that passes through the display panel body and connects the first surface and the second surface. The first protective film is arranged on the first surface and has a second through hole connected to the first through hole. The second protective film is arranged on the second surface. The sealant fills the first through hole, so that a sidewall of the display panel body which is exposed by the first through hole is sealed, and a material of the sealant is a curable material.

25 Claims, 13 Drawing Sheets

(51) Int. Cl.
  *H01L 25/18* (2006.01)
  *G02B 1/14* (2015.01)
  *G02F 1/1341* (2006.01)
  G09G 3/34 (2006.01)
  G02F 1/1345 (2006.01)

(52) U.S. Cl.
  CPC ........ *H01L 27/124* (2013.01); *H01L 27/1248* (2013.01); *G02F 2001/13456* (2013.01); *G02F 2201/56* (2013.01); *G09G 3/344* (2013.01); *G09G 2300/0426* (2013.01); *H01L 2924/0002* (2013.01)

(58) Field of Classification Search
  CPC ............ G02F 1/134309; G02F 1/1345; G02F 1/134336; G02B 1/14; G09G 2300/0426; G09G 3/344; G09G 3/3622; H01L 27/124; H01L 27/1248; H01L 25/18
  USPC ...................................................... 257/59, 72
  See application file for complete search history.

(56) References Cited

U.S. PATENT DOCUMENTS

| | | | |
|---|---|---|---|
| 6,507,332 | B1 | 1/2003 | Kuwabara et al. |
| 6,522,317 | B1 | 2/2003 | Satou et al. |
| 7,095,475 | B2 | 8/2006 | Shih |
| 7,729,040 | B2 | 6/2010 | Uchida |
| 7,733,554 | B2 | 6/2010 | Danner et al. |
| 8,736,544 | B2 | 5/2014 | Shimoshikiryoh et al. |
| 8,743,047 | B2 | 6/2014 | Kawabata et al. |
| 8,772,780 | B2 | 7/2014 | Huang et al. |
| 8,878,760 | B2 | 11/2014 | Kawabata et al. |
| 9,097,921 | B2 | 8/2015 | Ogasawara et al. |
| 9,312,284 | B2* | 4/2016 | Wu ...................... H01L 27/124 |
| 9,354,459 | B2* | 5/2016 | Nakamizo ............ G09G 3/3655 |
| 2002/0140664 | A1 | 10/2002 | Enomoto et al. |
| 2005/0140642 | A1 | 6/2005 | Chiu et al. |
| 2005/0264511 | A1 | 12/2005 | Takaki |
| 2005/0270266 | A1 | 12/2005 | Lin et al. |
| 2008/0123178 | A1* | 5/2008 | Uchida ................. G02F 1/1313 359/296 |
| 2008/0157067 | A1* | 7/2008 | Shiba ................... G09G 3/3225 257/40 |
| 2008/0225216 | A1* | 9/2008 | Shimodaira ........... G02F 1/1345 349/143 |
| 2008/0266210 | A1 | 10/2008 | Nonaka |
| 2009/0257016 | A1 | 10/2009 | Ito et al. |
| 2010/0061195 | A1 | 3/2010 | Kanbayashi |
| 2010/0066967 | A1* | 3/2010 | Takahashi ......... G02F 1/136286 349/143 |
| 2010/0141570 | A1* | 6/2010 | Horiuchi .............. G09G 3/3611 345/100 |
| 2010/0155729 | A1* | 6/2010 | Yang .................... G02F 1/1345 257/52 |
| 2010/0328292 | A1 | 12/2010 | Akiyama et al. |
| 2011/0007045 | A1 | 1/2011 | Bayrle et al. |
| 2011/0090205 | A1 | 4/2011 | Ito |
| 2011/0127536 | A1 | 6/2011 | Yoshida et al. |
| 2012/0057091 | A1 | 3/2012 | Kawabata et al. |
| 2012/0098739 | A1 | 4/2012 | Hsieh et al. |
| 2012/0104419 | A1 | 5/2012 | Liao et al. |
| 2012/0235969 | A1 | 9/2012 | Burns et al. |
| 2013/0038806 | A1* | 2/2013 | Tae ........................ G09G 3/006 349/43 |
| 2013/0050226 | A1 | 2/2013 | Shenoy et al. |
| 2013/0168707 | A1 | 7/2013 | Huang et al. |
| 2013/0229587 | A1 | 9/2013 | Takama et al. |
| 2013/0235279 | A1* | 9/2013 | Sugisaka .............. G02F 1/1345 348/739 |
| 2014/0027044 | A1 | 1/2014 | Kayal et al. |
| 2014/0043306 | A1* | 2/2014 | Min ..................... G09G 3/3685 345/204 |
| 2014/0285334 | A1* | 9/2014 | Sano ..................... B60K 35/00 340/441 |
| 2015/0116618 | A1* | 4/2015 | Kita .................... G02F 1/13458 349/43 |
| 2015/0206470 | A1 | 7/2015 | Wu et al. |
| 2015/0214246 | A1 | 7/2015 | Wu et al. |

FOREIGN PATENT DOCUMENTS

| | | |
|---|---|---|
| CN | 201864685 | 6/2011 |
| CN | 102270408 | 12/2011 |
| TW | I464158 | 12/2014 |

OTHER PUBLICATIONS

"Office Action of Taiwan Counterpart Application", issued on Sep. 11, 2015, p. 1-p.6, in which the listed references (Ref.1-3) were cited.

"Office Action of Taiwan Counterpart Application", issued on Jan. 8, 2016, p. 1-p. 6, in which the listed reference was cited.

* cited by examiner

ACTIVE DEVICE ARRAY SUBSTRATE AND DISPLAY PANEL

CROSS-REFERENCE TO RELATED APPLICATION

This application is a continuation-in-part application of and claims the priority benefit of a prior application Ser. No. 14/301,346, filed on Jun. 11, 2014, now pending, which claims the priority benefit of Taiwan application serial no. 102141090, filed on Nov. 12, 2013. This application also claims the priority benefit of Taiwan application serial no. 103139596, filed on Nov. 14, 2014. The entirety of each of the above-mentioned patent applications is hereby incorporated by reference herein and made a part of this specification.

FIELD OF THE INVENTION

The invention relates to a substrate and a panel, and more particularly to an active device array substrate and a display panel.

DESCRIPTION OF RELATED ART

With the spread of information products and development in technology, it has always been a primary goal to produce a display characterized in being light, thin, and flexible. An electrophoresis display is one of the displays that catch a lot of attention. Currently, a commonly seen electrophoresis display is assembled by an electrophoresis display film and an active device array substrate. Generally speaking, the signals of the active device array substrate are transmitted through the conductive wires disposed at a border edge outside the display area. Accordingly, the border edge of the active device array substrate has to have sufficient space for the arrangement of the conductive wires. However, as the demand for higher resolution grows, the number of conductive wires also increases. Consequently, the active device array substrate needs more space for the conductive wires to be configured therein, which would inevitably restrain the design of the display products from being light, thin, short and compact.

Moreover, the design of integrating a display panel into a wearable device has become more and more popular. In response to different application fields, the structure of the display panel may be specifically designed if the display panel is to be integrated into the wearable device. For instance, if the display panel is to be integrated into a watch as a watch dial, a through hole is required to be formed in the center of the wearable display panel, so that mechanical hands can be installed. The through hole may, however, pose a negative impact on the structural design of the display panel and may further impair the performance of the display panel. Hence, if a display panel requires specific structural design, how to comply with the structural design requirements of the wearable device without affecting or impairing the wearable device is one of the considerations to be weighed.

SUMMARY OF THE INVENTION

The invention is directed to an active device array substrate which has a slim border and allows a display panel to have a great performance.

The invention is directed to a display panel with great performance.

In an embodiment of the invention, an active device array substrate includes a substrate, a plurality of first signal lines, a plurality of second signal lines, a plurality of pixel units, a plurality of selection lines, an insulating layer, a sealant, and a driving unit. The substrate has a reference axis, an active area, a periphery area located around the active area and a through hole passing through the substrate and located in the active area. The reference axis divides the active area into a first region and a second region. The first signal lines are disposed in the active area of the substrate, wherein a portion of the first signal lines bypass the through hole. The second signal lines are disposed on the substrate and interlace with the first signal lines, wherein a portion of the second signal lines bypass the through hole. The pixel units are disposed within the active area and electrically connected to the corresponding first signal lines and the corresponding second signal lines. The selection lines are disposed on the substrate and extend from the active area to the periphery area along with the second signal lines, wherein a portion of the selection lines bypass the through hole. The insulating layer is disposed among the first signal lines, the second signal lines, and the selection lines and has a plurality of contact holes. The contact holes are disposed corresponding to the first signal lines, and a portion of the selection lines is electrically connected to the first signal lines respectively via the contact holes. The contact holes are divided into a plurality of first contact holes located within the first region and a plurality of second contact holes located within the second region. The sealant fills the through hole, so as to seal a sidewall of the substrate exposed by the through hole, a material of the sealant being a curable material. The driving unit is disposed on the substrate and located in the periphery area, wherein the second signal lines and a portion of the selection lines are electrically connected to the driving unit.

In an embodiment of the invention, a display panel that includes a display panel body, a first protective film, a second protective film, and a sealant is provided. The display panel body has a first surface, a second surface opposite to the first surface, and a first through hole that passes through the display panel body and connects the first surface and the second surface. The first protective film is arranged on the first surface and has a second through hole connected to the first through hole. The second protective film is arranged on the second surface. The sealant fills the first through hole, so as to seal a sidewall of the display panel body which is exposed by the first through hole, and a material of the sealant is a curable material.

In an embodiment of the invention, a display panel includes the active device array substrate above mentioned, an electrophoretic display film, a first protective film and a second protective film. The electrophoretic display film is disposed on the active device array substrate and has a first via, wherein the first via is communicated with the through hole so as to define a first through hole, and the sealant extends and fills the first through hole so as to seal side sidewalls of the active device array substrate and the electrophoretic display film. The first protective film is disposed on the active device array substrate and has a second through hole, wherein the active device array substrate is located between the first protective film and the electrophoretic display film, and the second through hole is communicated with the first through hole. The second protective film is disposed on the electrophoretic display film, wherein the electrophoretic display film is located between the second protective film and the active device array substrate.

In view of the above, the active device array substrate provided in an embodiment of the invention is equipped with the through hole; since the sealant serves to seal the sidewall of the active device array substrate exposed by the through hole, the performance of the active device array substrate may not be impaired. As a result, the active device array substrate provided herein and a display panel and a display in which the aforesaid active device array substrate is employed can be characterized by favorable performance.

Several exemplary embodiments accompanied with figures are described in detail below to further describe the invention in details.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the invention.

DETAILED DESCRIPTION OF DISCLOSED EMBODIMENTS

Figure 1:
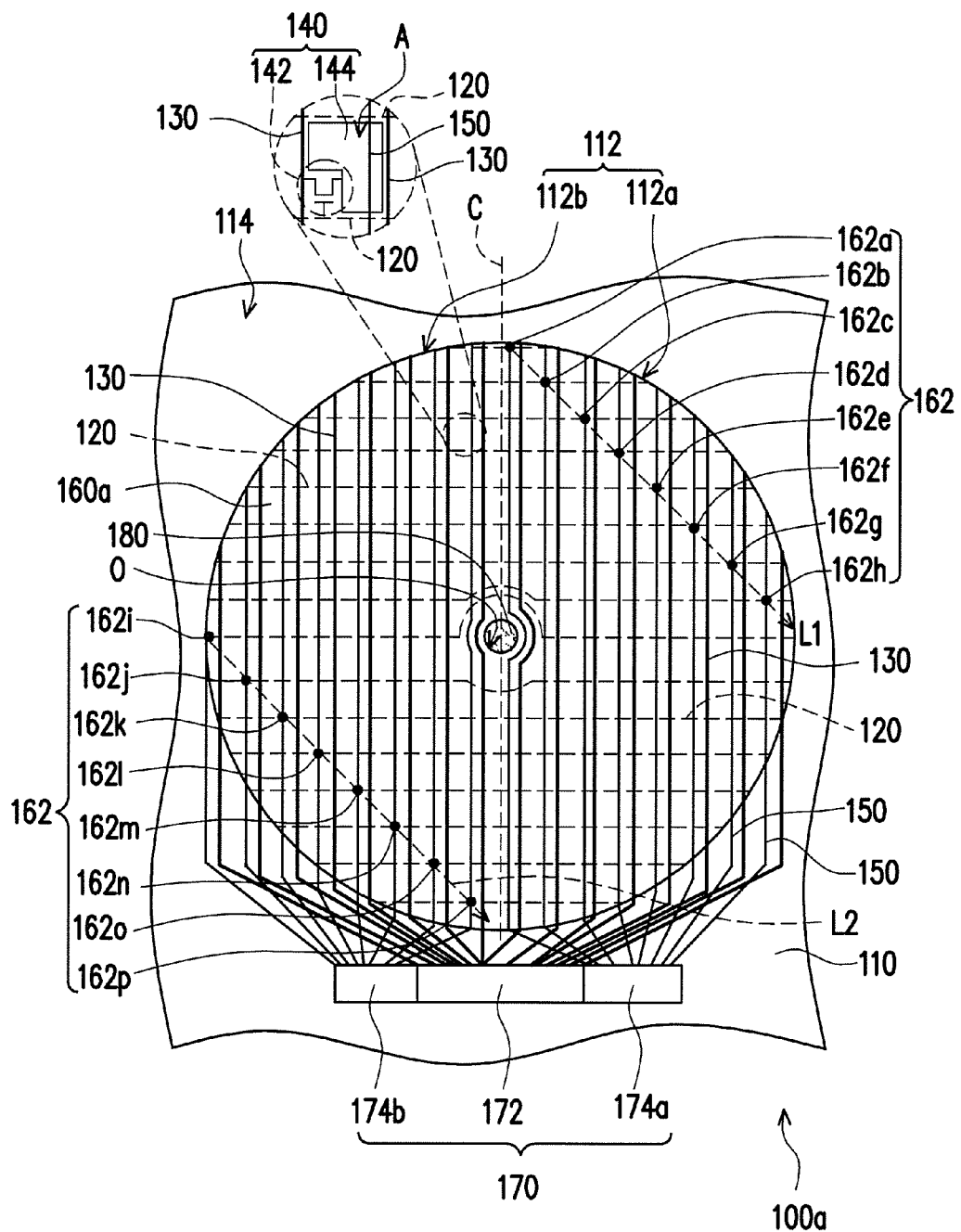
FIG. 1 is a schematic view illustrating an active device array substrate according to an embodiment of the invention.

FIG. 1 is a schematic view illustrating an active device array substrate according to an embodiment of the invention. Please refer to FIG. 1. In the embodiment, an active device array substrate 100a includes a substrate 110, a plurality of first signal lines 120, a plurality of second signal lines 130, a plurality of pixel units 140, a plurality of selection lines 150, an insulating layer 160a, a sealant 180, and a driving unit 170. A substrate 110 has a reference axis C, an active area 112, a periphery area 114 located around the active area 112 and a through hole O passing through the substrate 110 and located in the active area 112, wherein the reference axis C divides the active area 112 into a first region 112a and a second region 112b. In an embodiment, it is defined that the reference axis C is a vertical line that goes from a highest position in the active area 112 toward the driving unit 170. The first signal lines 120 are disposed in the active area 112 of the substrate 110, and a portion of the first signal lines 120 bypass the through hole O. The second signal lines 130 are disposed on the substrate 110 and interlace with the first signal lines 120, and a portion of the second signal lines 130 bypass the through hole O. As shown in FIG. 1, the second signal lines 130 interlace with the first signal lines 120 vertically; however, the invention is not limited thereto. Meanwhile, the first signal lines 120 and the second signal lines 130 define a plurality of pixel regions A. The pixel units 140 are respectively disposed within the active area 112 and electrically connected to the corresponding first signal lines 120 and the second signal lines 130. Herein, the pixel units 140 are formed of an active device 142 and a pixel electrode 144 and located within the pixel region A; however, the invention is not limited thereto. The selection lines 150 are disposed on the substrate 110 and, along with the second signal lines 130, extend from the active area 112 to the periphery area 114. Herein, a portion of the selection lines 150 also bypass the through hole O.

The insulating layer 160a is disposed among the first signal lines 120, the second signal lines 130, and the selection lines 150 and has a plurality of contact holes 162. The contact holes 162 are respectively disposed corresponding to the first signal lines 120. Moreover, the selection lines 150 are electrically connected to the first signal lines 120 respectively via the contact holes 162. As shown in FIG. 1, the contact holes 162 may be divided into a plurality of first contact holes 162a~162h located within the first region 112a and a plurality of second contact holes 162i~162p located within the second region 112b. The sealant 180 fills the first through hole O, so as to seal a sidewall of the substrate 110 exposed by the through hole O, a material of the sealant 180 being a curable material. The driving unit 170 is disposed on the substrate 110 and located in the periphery area 114, wherein the second signal lines 130 and the selection lines 150 are electrically connected to the driving unit 170. A position of a connection line L1 formed by orthogonal projections of the first contact holes 162a~162h formed on the substrate 110 is in a direction that is a farthest from the driving unit 170 and a closest to the reference axis C toward a direction that is close to the driving unit 170 and distant from the reference axis C. A position of a connection line L2 formed by orthogonal projections of the second contact holes 162i~162p formed on the substrate 110 is in a direction that is a closest to the driving unit 170 and the reference axis C toward a direction that is farther from the driving unit 170 and the reference axis C. In particular, the selection line 150 corresponding to the first contact hole 162a a farthest from the driving unit 170 and a closest to the reference axis C, and the selection line 150 corresponding to the second contact hole 162p which is closest to the driving unit 170 and the reference axis C, respectively are configured to receive a start signal and a terminal signal provided by the driving unit 170.

As shown in FIG. 1, in the embodiment, a specific shape of the active area 112 of the substrate 110 is a circle shape, and the reference axis C is specifically a central axis of the circle. Certainly, in other embodiments that are not shown, a shape of the active area may also be a regular pentagon shape, an oval shape, or other suitable shapes. Preferably, the shape of the active area is a symmetrical shape having a reference axis, wherein the reference axis is not necessarily a central axis of the shape of the active area. In the meantime, the selection line 150 is located between two adjacent second signal lines 130; that is, there is only one selection line 150 between the adjacent second selection lines 130. In the pixel array defined alternately by the first signal lines 120 and the second signal lines 130, a number of the pixel units 140 in the longest column is substantially equivalent to a number of the pixel units 140 in the longest row. Each selection line 150 corresponds to one of the contact holes 162, and each selection line 150 is connected to the driving unit 170. Specifically, in the embodiment, a connection line formed by orthogonal projections of the first contact holes 162a~162h on the substrate 110 and a connection line formed by orthogonal projections of the second contact holes 162i~162p on the substrate 110 are two parallel lines L1, L2; however, the invention is not limited thereto. In addition, in the embodiment, the first signal lines 120 are specifically scan lines, and the second signal lines 130 are specifically data lines; however, the invention provides no limitation to the form of the first signal lines 120 and the second signal lines 130.

The substrate 110 has the through hole O; therefore, by filling the through hole O with the sealant 180 and curing the sealant 180 through pertaining a curing process (e.g., a thermal curing process or a radiation-curing process), the sealant 180 can be in close contact with the sidewall of the substrate 110 exposed by the through hole O, and the performance of the active device array substrate 100 may not be impaired. As a result, the active device array substrate 100 provided herein is characterized by favorable performance. It should be noted that, based on different design requirements, the through hole O may be in a cylindrical shape as shown in the drawings, while the invention is not limited thereto.

In the embodiment, the driving unit 170 specifically includes a first driving unit 172 and two second driving units 174a and 174b, wherein the first driving unit 172 is located between the second driving units 174a and 174b. As shown in FIG. 1, in the embodiment, the second signal lines 130 are electrically connected to the first driving unit 172, and the selection lines 150 are electrically connected to the second driving units 174a and 174b. It should be noted that, when the first signal lines 120 are scan lines and the second signal lines 130 are data lines, the first driving unit 172 is specifically a source driving unit, and the second driving units 174a and 174b are specifically gate driving units.

When the driving unit 170 provides a driving signal, a start signal provided by the second driving unit 174a is transmitted by the selection lines 150 from the first contact hole 162a to the first signal lines 120 the farthest from the driving unit 170. Thereafter, the second driving units 174b and 174a provide a signal to the selection lines 150 in sequence, and the selection lines 150 transmit the signal from the first contact holes 162b~162h and the second contact holes 162i~162o to the first signal lines 120. Finally, the terminal signal provided by the second driving unit 174b is transmitted by the selection lines 150 from the second contact hole 162p to the first signal line 150 the closest to the driving unit 170. It can be obtained that the driving signals provided by the second driving units 174a and 174b are in the same direction namely to the right. It should be noted that the direction is the same as the direction of the connection lines of the orthogonal projection positions of the first contact holes 162a~162h and the second contact holes 162i~162p formed on the substrate 110, namely two parallel lines L1 and L2 in a direction that goes from upper left to the lower right as shown in FIG. 1.

Figure 2:
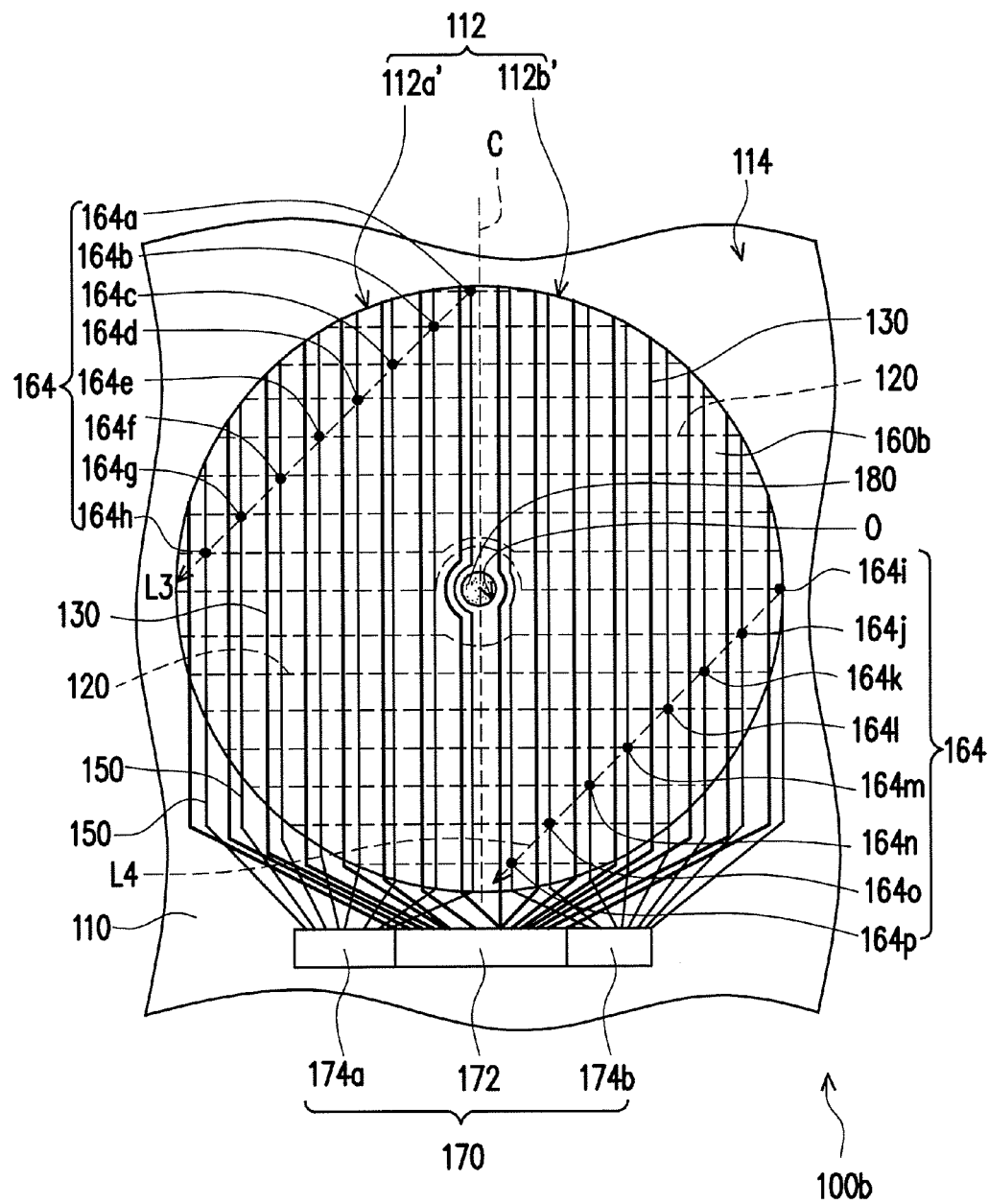
FIG. 2 is a schematic view illustrating an active device array substrate according to another embodiment of the invention.

Certainly, in other embodiments, please refer to FIG. 2, the first contact holes 164a~164h and the second contact holes 164i~164p of the contact holes 164 in the insulating layer 160b of the active device array substrate 100b are respectively located within a first region 112a' and the second region 112b' of the active area 112'. The connection lines of the orthogonal projection positions of the first contact holes 164a~164h and the second contact holes 164i~164p formed on the substrate 110 may be two parallel lines L3 and L4 in a direction that goes from the upper right to the lower left. Meanwhile, the driving direction of the driving unit 170 is in the same direction namely to the left, which still belongs to an adoptable technical solution for the invention and does not depart from the scope to be protected by the invention.

Since the active device array substrates 100a and 100b in the embodiment adopt the stacked type wiring arrangement, which enables the selection lines 150 to be electrically connected to the first signal lines 120 via the first contact holes 162a~162h, 164a~164h and the second contact holes 162i~162p, 164i~164p so that the area required for wiring arrangement can be reduced, the active device array substrates 100a and 100b in the embodiment may have a slim border. In addition, since the start signal provided by the second driving unit 174a and the terminal signal provided by the second driving unit 174b of the driving signal 170 in the embodiment are provided to the selection lines 150 corresponding to the first contact holes 162a, 164a and the second contact holes 162p, 164p adjacent to two sides of the reference axis C, the first signal line 120 the farthest from the driving unit 170 to the first signal line 120 the closest to the driving unit 170 may be turned on one by one according to the design of the contact holes 162a~162p and 164a~164p. Moreover, the driving direction of the driving unit 170 is in the same direction, that is, simultaneously to the left or to the right. Accordingly, the active device array substrates 100a and 100b in the embodiment have good display quality.

It should be noted that the following embodiments adopt the reference numbers and a part of the content described in the above embodiments, wherein the same references numbers are used for describing the same or similar devices, and the descriptions for the same technical content are omitted. Regarding the omitted description, please refer to the above embodiments for details; no further descriptions are incorporated in the following embodiments.

Figure 3:
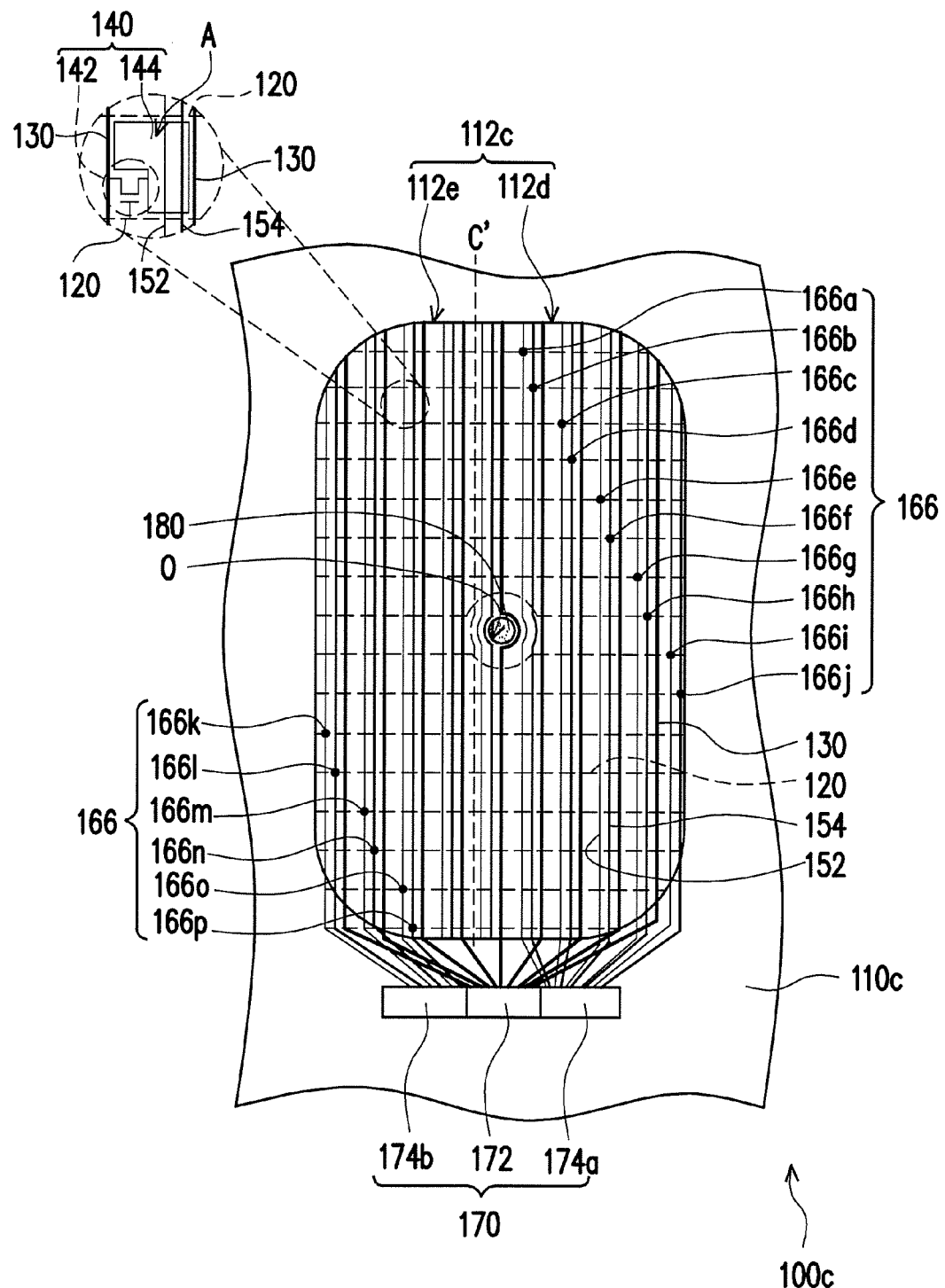
FIG. 3 is a schematic view illustrating an active device array substrate according to another embodiment of the invention.

FIG. 3 is a schematic view illustrating an active device array substrate according to another embodiment of the invention. Please refer to FIG. 3. In the embodiment, the active device array substrate 100c is similar to the active device array substrate 100a in FIG. 1. The major difference between the two substrates lies in that the specific outline of an active area 112c of the substrate 110c in the embodiment is a rectangular shape having rounded corners; the first contact holes 166a~166j and the second contact holes 166k~166p of the contact holes 166 are respectively located within a first region 112d and a second region 112e divided by a reference axis C'. Moreover, the selection line in the embodiment includes a plurality of first selection lines 152 and a plurality of second selection lines 154. Each of first selection lines 152 and each of the second selection lines 154 are located between two adjacent second signal lines 130, that is, there are one first selection line 152 and one second selection line 154 between two adjacent second selection lines 130. In the meantime, in the pixel array defined alternately by the first signal lines 120 and the second signal lines 130, a number of the pixel units 140 in the longest column is substantially greater than a number of the pixel units 140 in the longest row.

It should be noted that, in the embodiment, not each of the first selection lines 152 and each of the second selection lines 154 have the corresponding contact holes 166, only the first selection line 152 and the second selection line 154 connected to the driving unit 170 are provided with the contact holes 166 corresponding to the first signal line 120. As shown in FIG. 3, the first selection line 152 and the second selection line 154 close to the reference axis C' are not connected to the second driving units 174a and 174b. Furthermore, in the embodiment, the number of the first contact holes 166a~166j within the first region 112d is greater than the number of the second contact holes 166k~166p within the second region 112e. Specifically, the first selection line 152 corresponding to the first contact hole 166a the farthest from the driving unit 170 and the closest to the reference axis C' and the second selection line 154 corresponding to the second contact hole 166p the closest to the driving unit 170 and the reference axis C' respectively receive a start signal and a terminal signal provided by the second driving units 174a and 174b. Besides, orthogonal projections of the first selection line 152 and the second selection line 154 formed on the substrate 110c overlap with an orthogonal projection of the pixel electrode 144 of the pixel unit 140 fowled on the substrate 110c; however, the invention is not limited thereto.

Figure 4:
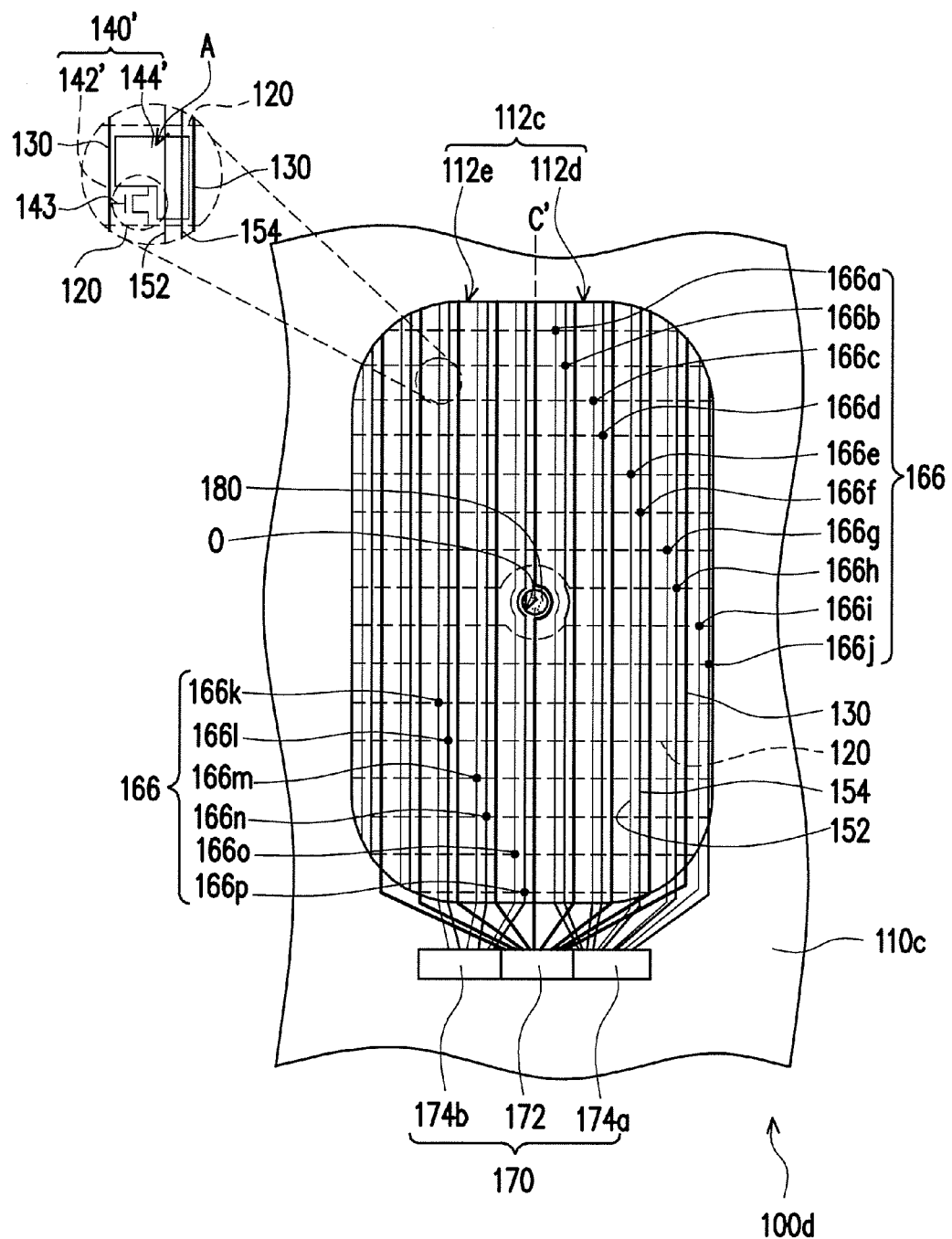
FIG. 4 is a schematic view illustrating an active device array substrate according to another embodiment of the invention.

FIG. 4 is a schematic view illustrating an active device array substrate according to another embodiment of the invention. Please refer to FIG. 4. In the embodiment, the active device array substrate 100d is similar to the active device array substrate 100c in FIG. 3; the major difference between the two substrates lies in that a gate 143 of an active device 142' of a pixel unit 140' in the embodiment is electrically connected to the second signal line 130; that is, the first signal line 120 is specifically a data line and the second signal line 130 is specifically a scan line. Meanwhile, orthogonal projections of the first selection line 152 and the second selection line 154 formed on the substrate 110c overlap with an orthogonal projection of the pixel electrode 144' of the pixel unit 140' formed on the substrate 110c; however, the invention is not limited thereto. Furthermore, the first driving unit 172 is specifically a gate driving unit, and the second driving units 174a and 174b are specifically source driving units. In other words, the forms of the first driving unit 172 and the second driving units 174a and 174b are adjusted according to the forms of the first signal line 120 and the second signal line 130. Apart from that, as shown in FIG. 4, a part of the first selection line 152 and a part of the second selection line 154 that are distant from the reference axis C' within the second region 112e are not connected to the second driving unit 174b.

Figure 5:
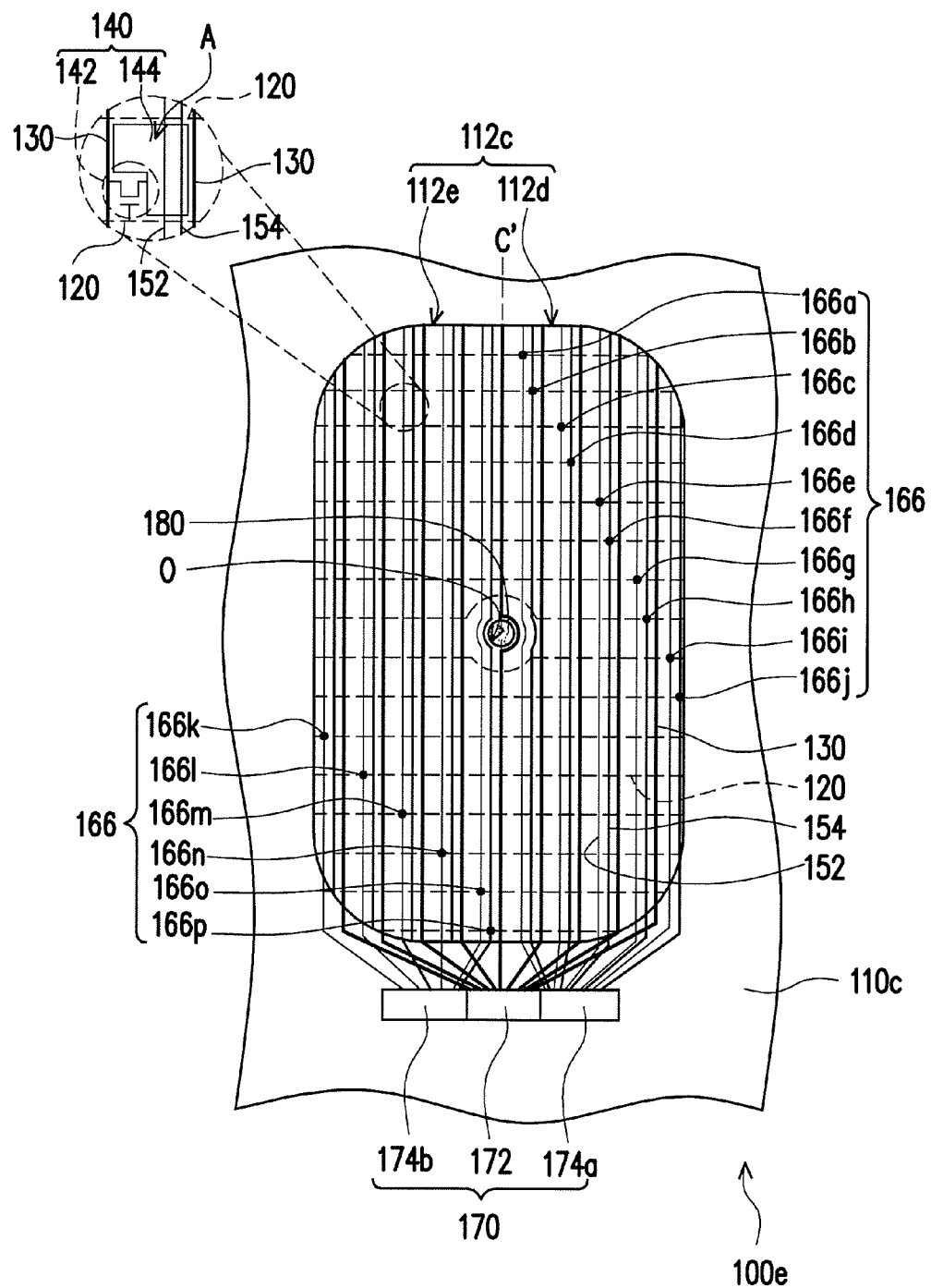
FIG. 5 is a schematic view illustrating an active device array substrate according to another embodiment of the invention.

FIG. 5 is a schematic view illustrating an active device array substrate according to another embodiment of the invention. Please refer to FIG. 5. The active device array substrate 100e in the embodiment is similar to the active device array substrate 100c in FIG. 3; the major difference between the two substrates lies in that only one of the second selection lines 154 within the second region 112e in the embodiment is connected to the second driving unit 174b, and the first selection lines 152 within the second region 112e are all connected to the second driving unit 174b. That is to say, the second contact holes 166k~166o within the second region 112e are disposed corresponding to the first selection line 152, and only the second contact hole 166p is disposed corresponding to the second selection line 154.

Figure 6:
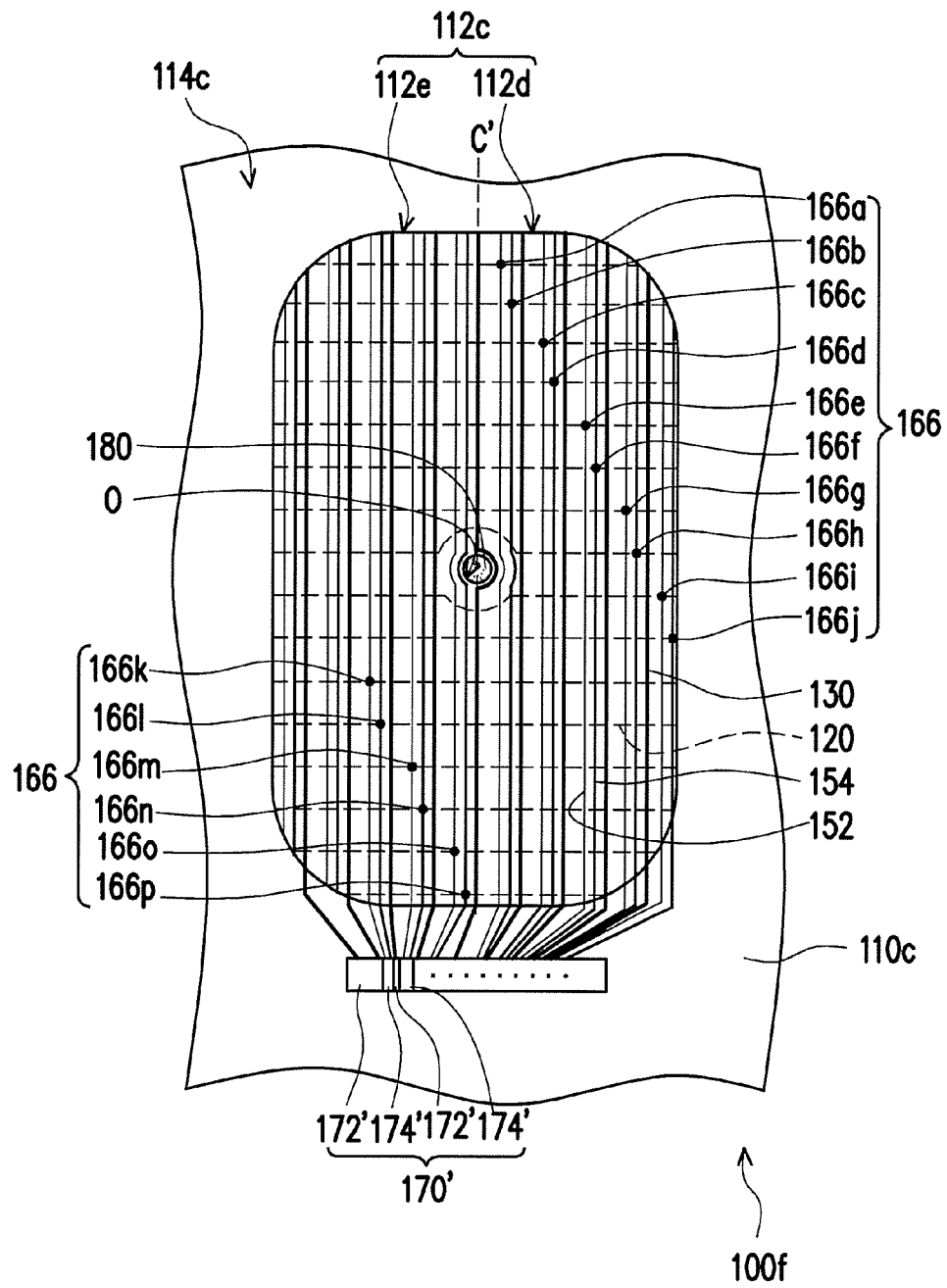
FIG. 6 is a schematic view illustrating an active device array substrate according to another embodiment of the invention.

FIG. 6 is a schematic view illustrating an active device array substrate according to another embodiment of the invention. Please refer to FIG. 6. The active device array substrate 100f in the embodiment is similar to the active device array substrate 100c in FIG. 3; the major difference between the two substrates lies in that the driving unit 170' in the embodiment is formed of a plurality of first driving units 172' and second driving units 174' disposed alternately, and therefore no interlacing wiring is required in the periphery area 114c of the substrate 110c.

Figure 7:
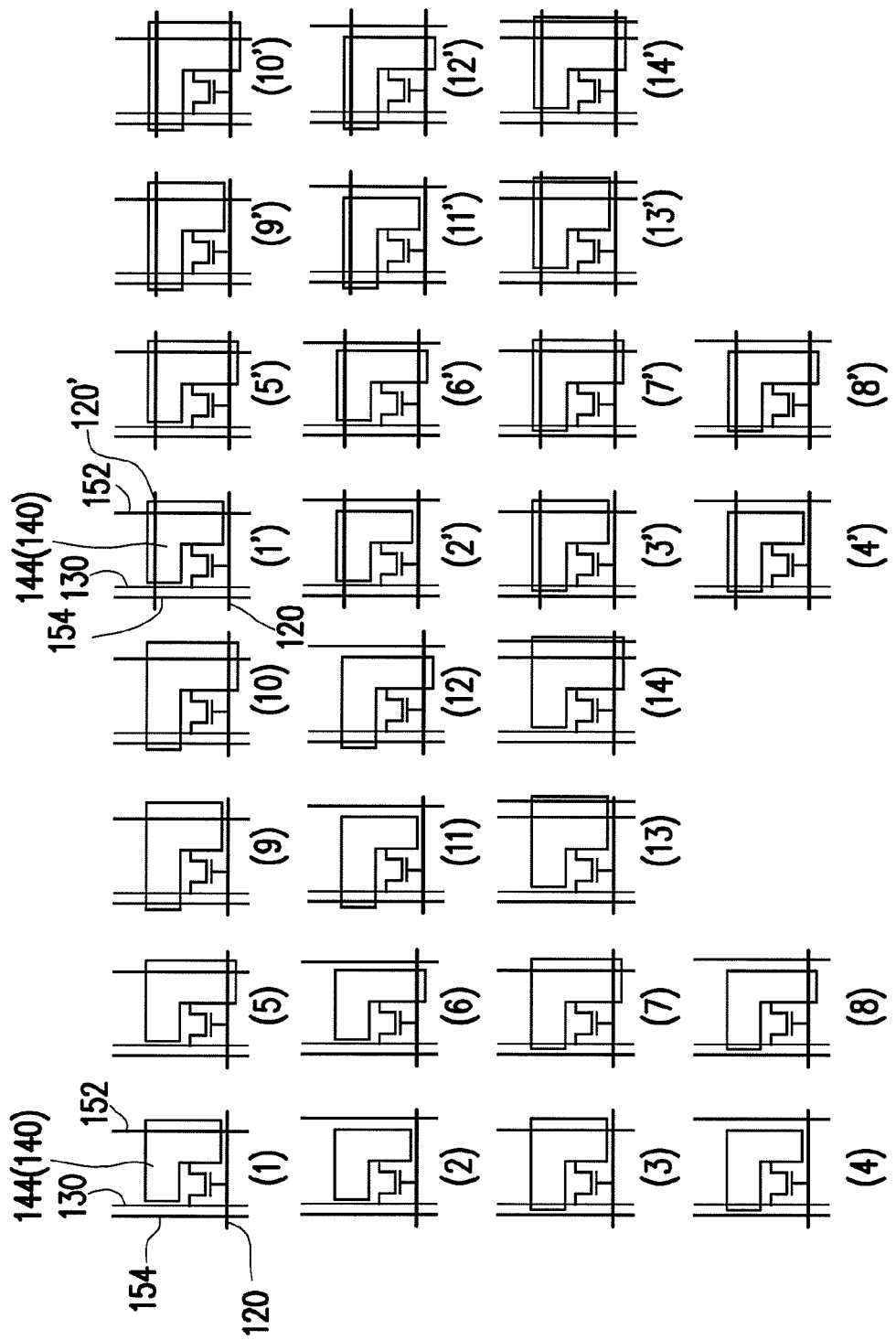
FIG. 7 is a schematic view illustrating a relative configuration among a first signal line, a second signal line, a first selection line, a second selection line, and a pixel electrode of a pixel unit according to a plurality of embodiments of the invention.

It should be pointed out that the invention provides no limitation to the forms that the first signal line 120, the second signal line 130, the first selection line 152 and the second selection line 154 overlap with the pixel electrodes 144 and 144' of the pixel units 140 and 140'. For example, please refer to FIG. 7, where an orthogonal projection of the pixel electrode 144 of the pixel unit 140 formed on the substrate (please see the substrate 110c in FIG. 3) may partially overlap with an orthogonal projection of the first selection line 152 formed on the substrate as shown in sub FIG. (1); or may not overlap with orthogonal projections of the first selection line 152, the second selection line 154, the first signal line 120, and the second signal line 130 formed on the substrate as shown in sub FIG. (2); or may partially overlap with orthogonal projections of the first selection line 152 and the second signal line 130 formed on the substrate as shown in sub FIG. (3); or may partially overlap with an orthogonal projection of the second signal line 130 formed on the substrate as shown in sub FIG. (4); or may partially overlap with orthogonal projections of the first selection line 152 and the first signal line 120 formed on the substrate as shown in FIG. (5); or may partially overlap with an orthogonal projection of the first selection line 120 formed on the substrate as shown in sub FIG. (6); or may partially overlap with orthogonal projections of the first selection line 152, the first signal line 120, and the second signal line 130 formed on the substrate as shown in sub FIG. (7); or may partially overlap with orthogonal projections of the first signal line 120 and the second signal line 130 formed on the substrate as shown in sub FIG. (8); or may partially overlap with orthogonal projections of the first selection line 152, the second selection line 154, and the second signal line 130 formed on the substrate as shown in sub FIG. (9); or may partially overlap with orthogonal projections of the first selection line 152, the second selection line 154, the first signal line 120, and the second signal line 130 formed on the substrate as shown in sub FIG. (10); or may partially overlap with orthogonal projections of the second selection line 154 and the second signal line 130 formed on the substrate as shown in sub FIG. (11); or may partially overlap with orthogonal projections of the second selection line 154, the first signal line 120, and the second signal line 130 formed on the substrate as shown in sub FIG. (12); or may partially overlap with orthogonal projections of the first selection line 152 and the second selection line 154 formed on the substrate as shown in sub FIG. (13); or may partially overlap with orthogonal projections of the first selection line 152, the second selection line 154, and the first signal line 120 foamed on the substrate as shown in sub FIG. (14). On the other hand, the difference between sub FIG. (1')~sub FIG. (14') and sub FIG. (1)~sub FIG. (14) merely lies in that an orthogonal projection of the pixel electrode 144 of the pixel unit 140 in sub FIG. (1')~sub FIG. (14') formed on the substrate (please see substrate 110c in FIG. 3) may further partially overlap with the first selection line 120' in another pixel region.

In addition, the invention does not provide limitation to that only one selection line 150 is provided between two adjacent second signal lines 130, or that only one first selection line 152 and one second selection line 154 are provided. In the embodiments that are not shown, when the first signal line 120 and the second signal line 130 interlace with each other and define the pixel array, and the number of the pixel units 140 in the longest column is greater than twice that of the pixel units 140 in the longest row, there may be three selection lines included between two adjacent second selection lines 130, which still belongs to an adoptable technical solution for the invention and does not depart from the scope to be protected by the invention.

Figure 8:
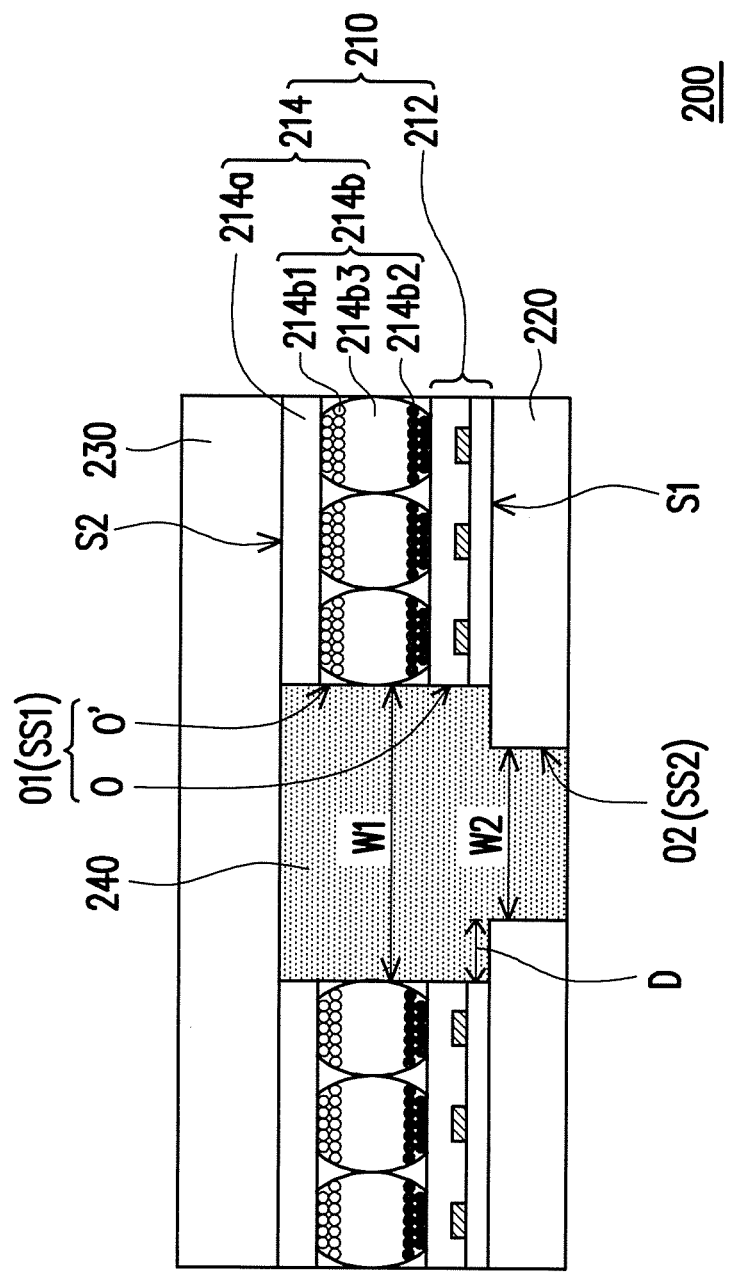
FIG. 8 is a schematic cross-sectional view illustrating a display panel according to a first embodiment of the invention.
Figure 9A:
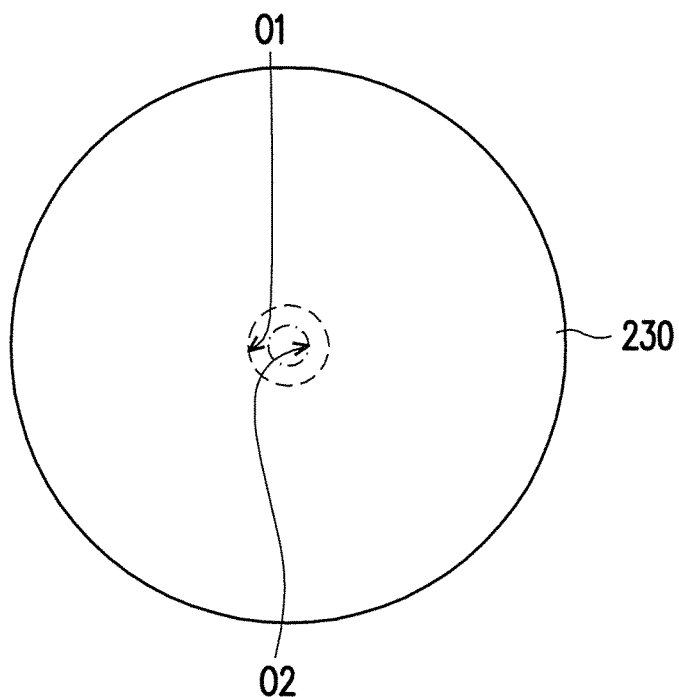
FIG. 9A is a schematic top view illustrating a display panel according to the first embodiment of the invention.

FIG. 8 is a schematic cross-sectional view illustrating a display panel according to a first embodiment of the invention. FIG. 9A is a schematic top view illustrating a display panel according to the first embodiment of the invention. With reference to FIG. 8 and FIG. 9A, a display panel 200 includes a display panel body 210, a first protective film 220, a second protective film 230, and a sealant 240.

The display panel 200 is applicable to a wearable device; here, the display panel body 210 is, for instance, an electrophoretic display panel which is characterized by flexibility and can be bent in response to the movement of corresponding body parts; however, the invention is not limited thereto. Specifically, the display panel body 210 includes the active device array substrate 212 as the above-mentioned active device array substrate 100a, 100b, 100c, 100d, 100e, or 100f and having the through hole O, and an electrophoretic display film 214 disposed on the active device array substrate 212 and having a first via O'. Herein, the first via O' is communicated with the through hole O so as to define a first through hole O1. According to variations in driver signals (e.g., electric field) of the active device array substrate 212, the electrophoretic display film 214 achieved gray-scale changes to images displayed on the display panel body 210. The electrophoretic display film 214 includes a flexible substrate 214a and a plurality of microcapsules 214b or a micro-cup package electrophoretic display material, for instance, which should however not be construed as a limitation to the invention. —Herein, each of the microcapsules 214b has a plurality of white charged particles 214b1, a plurality of black charged particles 214b2 and an electrophoresis medium 214b3, herein the white charged particles 214b1 and the black charged particles 214b2 are doped in the electrophoresis medium 214b3. Based on different design requirements, the display panel body 210 may further include other film layers or other devices, e.g., a touch device. Specifically, the display panel body 210 may include a color filter layer which is not shown in the drawings, so as to achieve full-color display. Certainly, the full-color display may also be accomplished by using colored display material and may not be limited to the above. For instance, if the electrophoretic display material is employed as the display medium, the display medium includes fluid and particles distributed in the fluid. Thereby, the full-color display effects may be achieved by colored particles or colored fluid.

The display panel body 210 has a first surface S1, a second surface S2 opposite to the first surface S1, and a first through hole O1 that passes through the display panel body 210 and connects the first surface S1 and the second surface S2. Based on different design requirements, the first through hole O1 may be in a cylindrical shape as shown in the drawings, while the invention is not limited thereto. The first protective film 220 is arranged on the first surface S1 and has a second through hole O2 connected to the first through hole O1. The second through hole O2 may also be in a cylindrical shape, for instance, while the invention is not limited thereto.

The first protective film 220 is disposed on the active device array substrate 212, wherein the active device array substrate 212 is located between the first protective film 220 and the electrophoretic display film 214. The second protective film 230 is arranged on the second surface S2 and covers the first through hole O1, wherein the second protective film 230 is disposed on the electrophoretic display film 214, and the electrophoretic display film 214 is located between the second protective film 230 and the active device array substrate 212. To be specific, the second protective film 230 provided in the present embodiment is a continuous thin film and completely covers the first through hole O1. An outer profile of the second protective film 230 corresponds to that of the display panel body 210. As shown in FIG. 9A, both the outer profile of the second protective film 230 and the outer profile of the display panel body 210 are circular, for instance. However, based on different design requirements, the outer profile of the second protective film 230 and the outer profile of the display panel body 210 may be in other different shapes or may have irregular shapes. It should be mentioned that the first and second protective films 220 and 230 are respectively adhered to the first surface S1 and the second surface S2 of the display panel body 210, and therefore the profiles of the first and second protective films 220 and 230 need not conform to the profile of the display panel body 210.

The sealant 240 fills the first through hole O1, so as to seal a sidewall SS1 of the display panel body 210 which is exposed by the first through hole O1. According to the present embodiment, the sealant 240 further fills the second through hole O2 and is in contact with a sidewall SS2 of the first protective film 220 exposed by the second through hole O2. A surface of the sealant 240 away from the first through hole O1 and the outer surface of the first protective film 220 (i.e., a surface of the first protective film 220 opposite to the first surface S1) are coplanar, which should however not be construed as a limitation to the invention. Due to different properties or amount of the material of the sealant 240, the surface of the sealant 240 away from the first through hole O1 may be lower or higher than the outer surface of the first protective film 220.

The sealant 240 is made of a curable material. The curable material includes epoxy resin, ultraviolet curing adhesive, or thermal-setting adhesive, which should however not be construed as a limitation to the invention. The display panel body 210 has the first through hole O1; therefore, by filling the first through hole O1 with the sealant 240 and curing the sealant 240 through performing a curing process (e.g., a thermal curing process or a radiation-curing process), the sealant 240 can be in close contact with the sidewall SS1 of the display panel body 210 exposed by the first through hole O1. As such, the flash issue of the display medium can be prevented, and the performance of the display panel body 210 may no longer be impaired; as a result, the display panel 200 can be characterized by outstanding performance.

In the present embodiment, a width W1 of the first through hole O1 is greater than a width W2 of the second through hole O2. Therefore, if the first through hole O1 is to be filled with the sealant 240, the sealant 240 is in a non-cured state and is capable of flowing. At this time, to prevent the display panel body 210 from being impaired, the temperature of the sealant 240 in the liquid state can be lower than the maximum endurable temperature of the display panel body 210. For instance, the sealant 240 may be made of a curable material which is capable of flowing at normal temperature. Said curable material may be cured by radiation or heat, for instance. If the sealant 240 is made of the material which can be cured by heat, the temperature at which the thermal-setting material is cured is preferably lower than or equal to the maximum endurable temperature of the display panel body 210.

As shown in FIG. 9A, the first through hole O1 and the second through hole O2 are basically formed in the center of the circular display panel 200, and therefore the sealant 240 shown in FIG. 8 is also arranged in the center of the display panel 200. The locations of the first and second through holes O1 and O2 may be adjusted in accordance with different design requirements. The sealant 240 is arranged in the center of the display panel 200. Note that no image is displayed in the center of the display panel 200, and the cured sealant 240 arranged in the center of the display panel 200 ensures favorable mechanical strength. Accordingly, the display panel 200 may be applied in diverse fields.

Figure 9B:
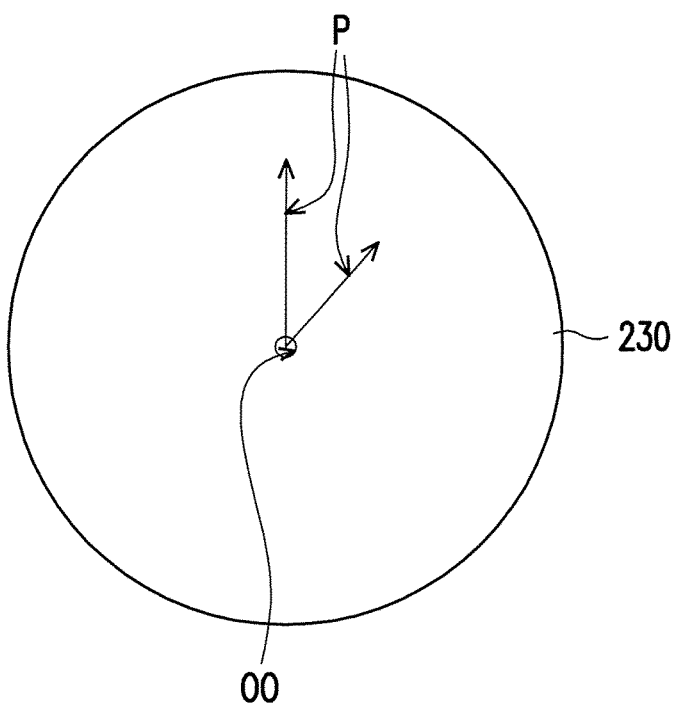
FIG. 9B is a schematic top view illustrating an application of the display panel depicted in FIG. 9A.

FIG. 9B is a schematic top view illustrating an application of the display panel depicted in FIG. 9A. In FIG. 9B, the display panel 200 serves as the watch dial of a smart watch, for instance, and a through hole OO can be formed in the center of the display panel 200, such that mechanical hands P can be arranged in the through hole OO. Thereby, the pivot holding the mechanical hands P can be inserted into the through hole OO. It can be derived from the above that the sealant 240 shown in FIG. 8 is characterized by high mechanical strength in the display panel 200; hence, if the through hole OO is formed in a region where the sealant 240 is arranged, the structural design of the display panel body 210 is not impaired. That is, in the present embodiment, the through hole OO passes through the second protective film 230 and the sealant 240 as shown in FIG. 8.

Figure 10A:
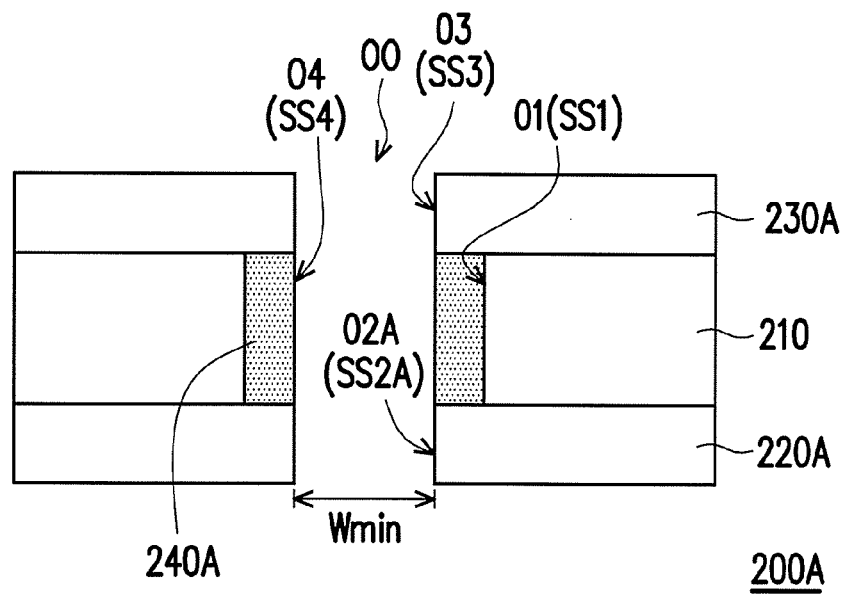
FIG. 10A to FIG. 10E are schematic cross-sectional views illustrating a display panel according to five different embodiments of the invention.

FIG. 10A to FIG. 10E are schematic cross-sectional views illustrating a display panel according to five different embodiments of the invention. With reference to FIG. 10A, the display panel 200A is formed by performing one drilling process on the display panel 200 shown in FIG. 8, for instance. After the drilling process is performed, the first protective film 220A has a second through hole O2A, the second protective film 230A has a third through hole O3, and the sealant 240A has a fourth through hole O4. Here, the fourth through hole O4 is connected between the second through hole O2A and the third through hole O3. In addition, the second, third, and fourth through holes O2A, O3, and O4 constitute the through hole OO where the pivot holding the mechanical hands P shown in FIG. 9B can be arranged.

The through hole OO is formed by performing one drilling process, and thus a sidewall SS2A of the first protective film 220A exposed by the second through hole O2A, a sidewall SS4 of the sealant 240A exposed by the fourth through hole O4, and a sidewall SS3 of the second protective film 230A exposed by the third through hole O3 constitute a continuous surface such as a cylindrical surface or a continuous curved surface. In a vertical cross-section of the display panel 200A taken along any direction passing the through hole OO, the continuous surface, constituted by the sidewall SS2A of the first protective film 220A exposed by the second through hole O2A, the sidewall SS4 of the sealant 240A exposed by the fourth through hole O4, and the sidewall SS3 of the second protective film 230A exposed by the third through hole O3, has a linear outline without a sharp turning angle interposed therein. Specifically, as shown in FIG. 10A, if the fixture employed in the drilling process is a column of which the width remains unchanged, the sidewall SS2A of the first protective film 220A exposed by the second through hole O2A, the sidewall SS4 of the sealant 240A exposed by the fourth through hole O4, and the sidewall SS3 of the second protective film 230A exposed by the third through hole O3 constitute a columnar surface, and the width of the through hole OO stays consistent and is not changed obviously and suddenly. Namely, the width of the second through hole O2A, the width of the third through hole O3, and the width of the fourth through hole O4 are identical.

Figure 10B:
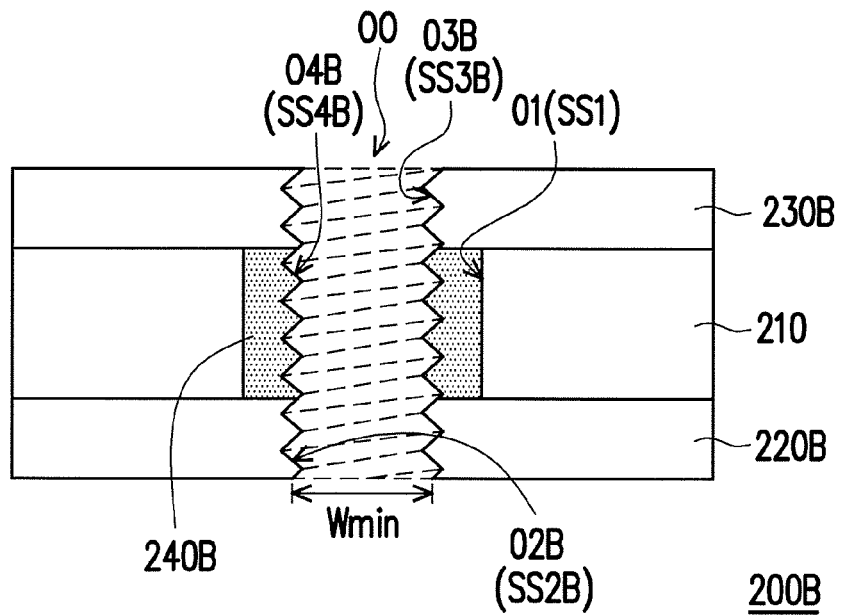

On the other hand, as shown in FIG. 10B, if the fixture employed in the drilling process is a column of which the width remains unchanged, and the column has threads, the sidewall SS2B of the first protective film 220B exposed by the second through hole O2B, the sidewall SS4B of the sealant 240B exposed by the fourth through hole O4B, and the sidewall SS3B of the second protective film 230B exposed by the third through hole O3B constitute a curved surface, and curvatures of the surface are continuous without a sudden change. The sidewalls SS2B, SS4B, and SS3B define the continuous threads, and the threads are arranged in a direction shown by dotted lines in FIG. 10B.

Figure 10C:
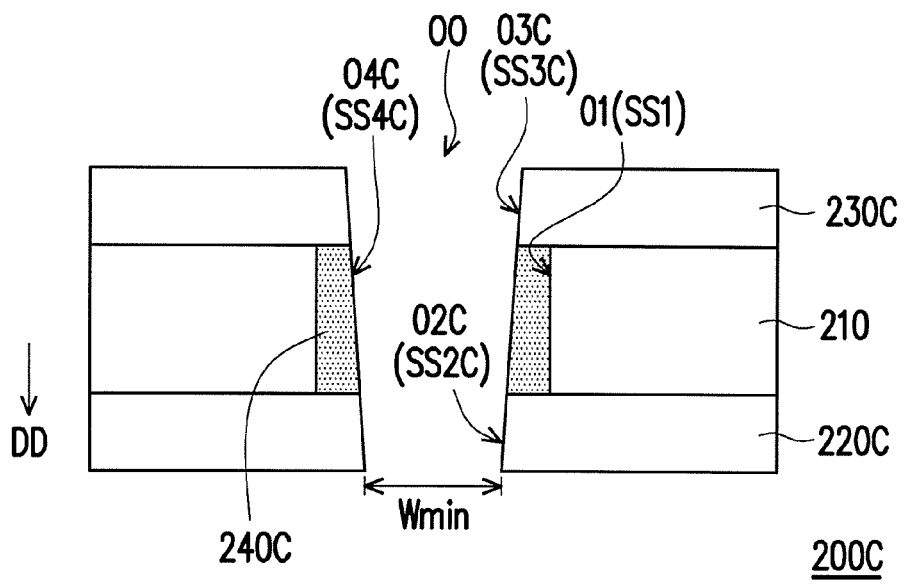

As illustrated in FIG. 10C, when the drilling process is a laser drilling process, the width of the through hole OO may be changed together with changes to the laser beam taper. For instance, if the laser drilling process is performed in a direction from the second protective film 230C to the first protective film 220C (i.e., a direction DD perpendicular to the first protective film 220C), the width of the second through hole O2C, the width of the third through hole O3C, and the width of the fourth through hole O4C gradually decrease in the direction DD. Such continuous changes to the widths allow the sidewall SS2C of the first protective film 220C exposed by the second through hole O2C, the sidewall SS4C of the sealant 240C exposed by the fourth through hole O4C, and the sidewall SS3C of the second protective film 230C exposed by the third through hole O3C to constitute a columnar surface. Besides, the width of the fourth through hole O4C and the width of the second through hole O2C are identical at an intersection of the sealant 240C and the first protective film 220C, and the width of the fourth through hole O4C and the width of the third through hole O3C are identical at an intersection of the sealant 240C and the second protective film 230C. In another embodiment of the invention, the laser drilling process can also be performed in a direction from the first protective film 220C to the second protective film 230C (i.e., a direction opposite to the direction DD).

Figure 10D:
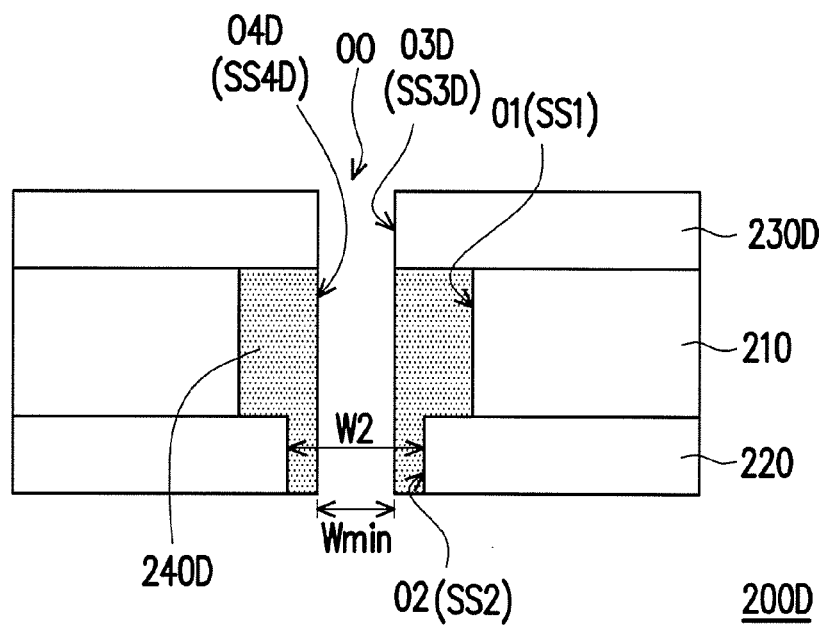

In the embodiments shown in FIG. 10A to FIG. 10C, the minimum width Wmin of the through hole OO is equal to or greater than the width W2 of the second through hole O2 shown in FIG. 8. That is, after the drilling process is performed, the sealant 240 which covers the sidewall SS2 of the first protective film 220 exposed by the second through hole O2 as shown in FIG. 8 is removed; however, the invention is not limited thereto. As shown in FIG. 10D, the minimum width Wmin of the through hole OO may be less than the width W2 of the second through hole O2. That is, after the drilling process is performed, the sealant 240 which covers the sidewall SS2 of the first protective film 220 exposed by the second through hole O2 as shown in FIG. 8 is thinned out and is not completely removed to form the sealant 240D, and the sealant 240D can still seal the sidewall SS2 of the first protective film 220 exposed by the second through hole O2.

After the drilling process is performed, the second protective film 230D has the third through hole O3D, and the sealant 240D has the fourth through hole O4D. The fourth through hole O4D is connected to the third through hole O3D. Besides, the sidewall SS4D of the sealant 240D exposed by the fourth through hole O4D and the sidewall SS3D of the second protective film 230D exposed by the third through hole O3D constitute a continuous surface.

Figure 10E:
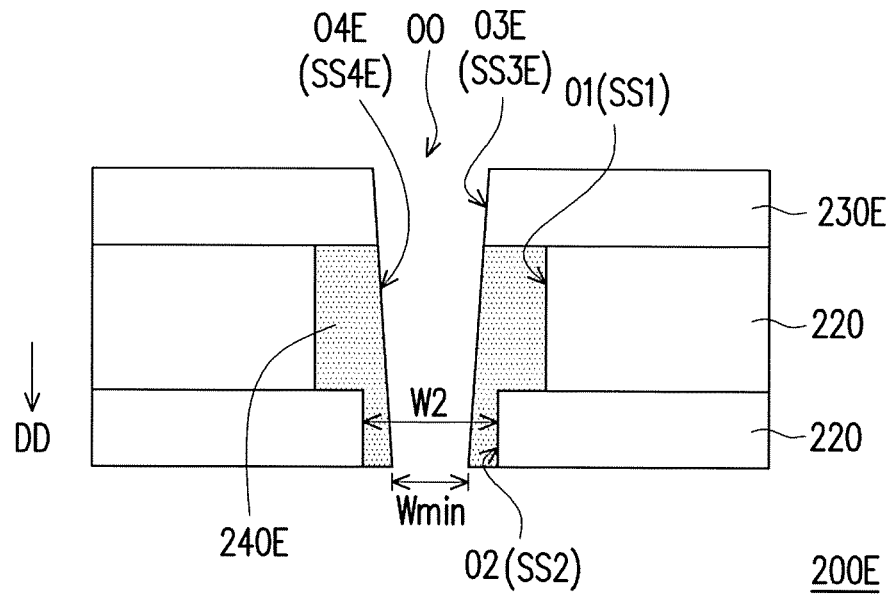

The width of the third through hole O3D and the width of the fourth through hole O4D are identical; however, the invention is not limited thereto. As shown in FIG. 10E, the width of the third through hole O3E and the width of the fourth through hole O4E may gradually decrease in the direction DD perpendicular to the display panel 200E, and the width of the fourth through hole O4E and the width of the third through hole O3E are identical at an intersection of the sealant 240E and the second protective film 230E. Additionally, the sidewall SS4E of the sealant 240E exposed by the fourth through hole O4E and the sidewall SS3E of the second protective film 230E exposed by the third through hole O3E also constitute a continuous surface.

Figure 11:
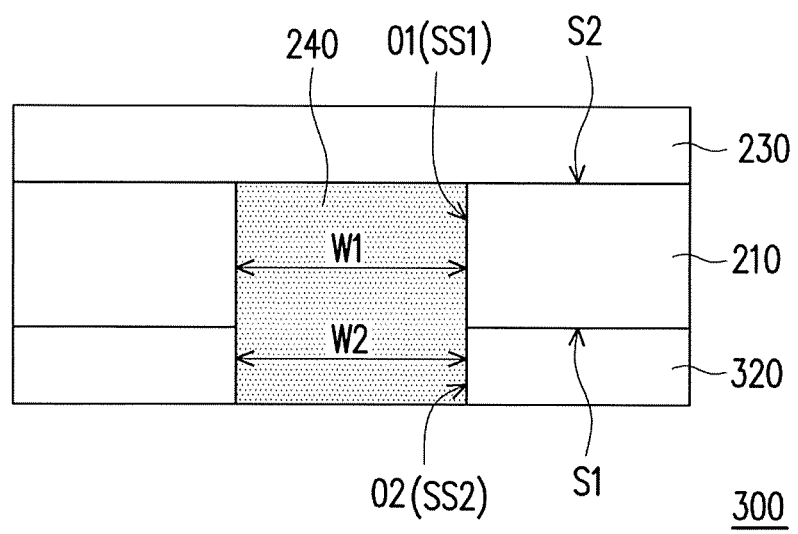
FIG. 11 is a schematic cross-sectional view illustrating a display panel according to a second embodiment of the invention.

The display panels 200A, 200B, 200C, 200D, and 200E respectively shown in FIG. 10A to FIG. 10E are formed by performing the drilling process on the display panel 200 shown in FIG. 8, and the sidewall SS2 of the first protective film 220 exposed by the second through hole O2 is shrunk inwardly by a distance D as compared to the sidewall SS1 of the display panel body 210 exposed by the first through hole O1 (as shown in FIG. 8), such that the width W2 of the second through hole O2 is less than the width W1 of the first through hole O1. However, the invention is not limited thereto. FIG. 11 is a schematic cross-sectional view illustrating a display panel according to a second embodiment of the invention. With reference to FIG. 11, the display panel 300 is substantially identical to the display panel 200, and the same elements are represented by the same reference numbers. Therefore, no further descriptions are provided herein. The main difference therebetween lies in that the sidewall SS1 of the display panel body 210 exposed by the first through hole O1 and the sidewall SS2 of the first protective film 320 exposed by the second through hole O2 are substantially aligned, as shown in FIG. 11, such that the width W2 of the second through hole O2 of the first protective film 320 is substantially equal to the width W1 of the first through hole O1 of the display panel body 210.

Figure 12A:
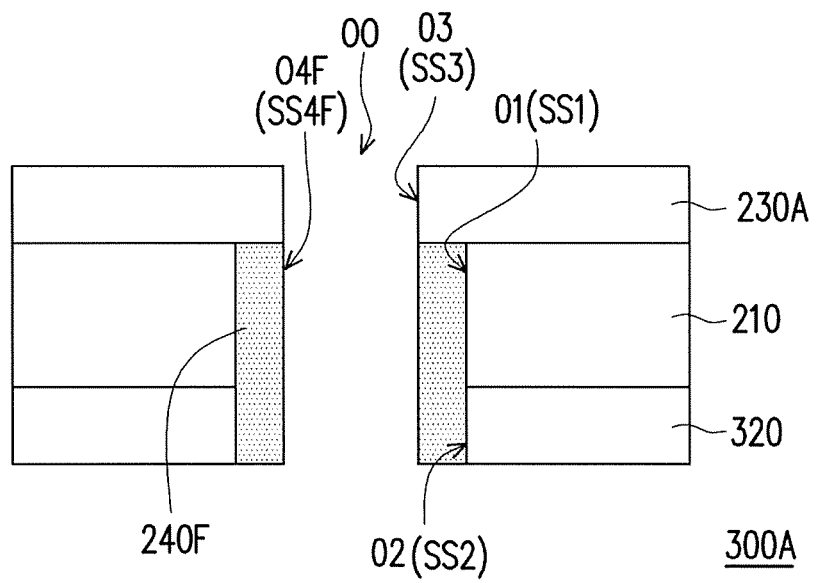
FIG. 12A to FIG. 12B are schematic cross-sectional views illustrating the display panel depicted in FIG. 11 according to two different embodiments of the invention after the display panel is be further processed.
Figure 12B:
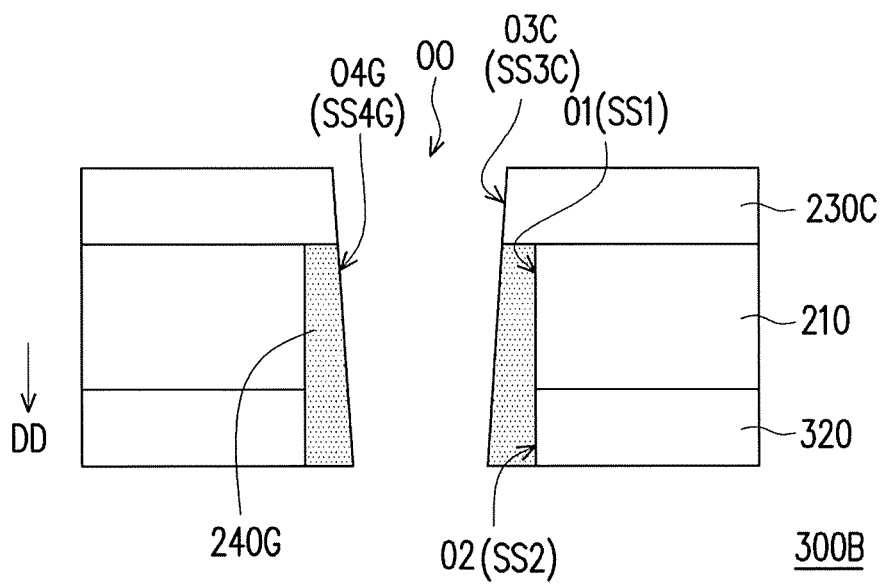

In response to different application fields, the through hole OO shown in FIG. 9B may be further formed in the center of the display panel 300, so as to accommodate the mechanical hands P or satisfy other requirements. FIG. 12A to FIG. 12B are schematic cross-sectional views illustrating the display panel depicted in FIG. 11 according to two different embodiments of the invention after the display panel is be further processed. With reference to FIG. 12A and FIG. 12B, the display panels 300A and 300B are formed by performing one drilling process on the display panel 300 shown in FIG. 11, for instance. The display panels 300A and 300B are substantially identical to the display panels 200D and 200E shown in FIG. 10D and FIG. 10E, respectively. The main difference therebetween lies in that the sidewall SS1 of the display panel body 210 exposed by the first through hole O1 and the sidewall SS2 of the first protective film 220 exposed by the second through hole O2 (as shown in FIG. 12A and FIG. 12B) are aligned to each other.

In the embodiments shown in FIG. 10A-FIG. 10E, FIG. 11, and FIG. 12A-FIG. 12B, the display panel body 210 has the first through hole O1; therefore, by filling the first through hole O1 with the sealant 240 (including the sealant 240A, 240B, 240C, 240D, 240E, 240F, and 240G) and curing the sealant 240 (including the sealant 240A, 240B, 240C, 240D, 240E, 240F, and 240G) through performing a curing process (e.g., a thermal curing process or a radiation-curing process), the sealant 240 (including the sealant 240A, 240B, 240C, 240D, 240E, 240F, and 240G) can seal the sidewall SS1 of the display panel body 210 exposed by the first through hole O1. As such, the flash issue of the display medium can be prevented, and the performance of the display panel body 210 may no longer be impaired; as a result, the display panels 200A, 200B, 200C, 200D, 200E, 300A, and 300B can be characterized by the outstanding performance.

In addition, in the display panels 200A, 200B, 200C, 200D, 200E, 300A, and 300B, the through hole OO is formed by performing one drilling process, such that the surface exposed by the through hole OO is a continuous surface. Through modifying the fixture employed in the drilling process, the width of the through hole OO can be adjusted, and the resultant through hole can be characterized by high precision. This is conducive to the increase in the competitiveness of the display panels 200A, 200B, 200C, 200D, 200E, 300A, and 300B.

To sum up, the display panel provided in an embodiment of the invention is equipped with the first through hole; since the sealant serves to seal the sidewall of the display panel body exposed by the first through hole, the performance of the display panel body may not be impaired. As a result, the display panel provided herein is characterized by favorable performance. Furthermore, since the active device array substrate of the invention adopts a stacked wiring arrangement, allowing the selection lines to be electrically connected to the first signal lines via the contact holes so that the area required for wiring arrangement is reduced, the active device array substrate of the invention may have a slim border. In addition, since the start signal and the terminal signal of the driving signal are both provided to the selection lines corresponding to the contact holes adjacent to two sides of the reference axis of the substrate, the invention may transmit the scan signal via the design of the selection lines and the contact holes, such that the first signal lines within the active area can be turned on one by one, allowing the active device array substrate of the invention to have a good display quality.

Although the invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:
1. An active device array substrate, comprising:
a substrate having a reference axis, an active area, a periphery area located around the active area and a through hole passing through the substrate and located in the active area, wherein the reference axis divides the active area into a first region and the second region;
a plurality of first signal lines disposed in the active area of the substrate, wherein a portion of the first signal lines bypass the through hole;

a plurality of second signal lines disposed on the substrate and interlacing with the first signal lines, wherein a portion of the second signal lines bypass the through hole;

a plurality of pixel units disposed within the active area and electrically connected to the corresponding first signal lines and the corresponding second signal lines;

a plurality of selection lines disposed on the substrate and extending from the active area to the periphery area along with the second signal lines, wherein a portion of the selection lines bypass the through hole;

an insulating layer disposed among the first signal lines, the second signal lines, and the selection lines and having a plurality of contact holes, the contact holes disposed corresponding to the first signal lines, and a portion of the selection lines electrically connected to the first signal lines respectively via the contact holes, wherein the contact holes are divided into a plurality of first contact holes located within the first region and a plurality of second contact holes located within the second region;

a sealant filling the through hole, so as to seal a sidewall of the substrate exposed by the through hole, a material of the sealant being a curable material; and a driving unit disposed on the substrate and located in the periphery area, wherein the second signal lines and a portion of the selection lines are electrically connected to the driving unit, wherein a position of a first connection line formed by orthogonal projection positions of the first contact holes formed on the substrate is disposed in a direction farthest from the driving unit and closest to the reference axis toward a direction close to the driving unit and distant from the reference axis, a position of a second connection line formed by orthogonal projection positions of the second contact holes formed on the substrate is disposed in a direction closest to the driving unit and the reference axis toward a direction distant from the driving unit and the reference axis, and the selection line corresponding to the first contact hole farthest from the driving unit and closest to the reference axis, and the selection line corresponding to the second contact hole closest to the driving unit and the reference axis, respectively, are configured to receive a start signal and a terminal signal provided by the driving unit.

2. The active device array substrate as recited in claim 1, wherein the driving unit comprises at least one first driving unit and a plurality of second driving units, and the first driving unit is located between the second driving units.

3. The active device array substrate as recited in claim 2, wherein one of the first driving unit and each of the second driving units is a gate driving unit, and the other one of the first driving unit and each of the second driving units is a source driving unit.

4. The active device array substrate as recited in claim 2, wherein the at least one first driving unit is a plurality of first driving units, and the first driving units and the second driving units are disposed alternately.

5. The active device array substrate as recited in claim 2, wherein the second signal lines are electrically connected to the first driving unit, and the selection lines are electrically connected to the second driving units.

6. The active device array substrate as recited in claim 1, wherein the selection lines and the second signal lines are arranged in parallel in the active area, and the selection lines and the second signal lines connected to the driving unit in the periphery area are non-interlaced with one another.

7. The active device array substrate as recited in claim 1, wherein each of the selection lines is located between the two adjacent second signal lines, and a number of the pixel units in a longest column is equivalent to a number of the pixel units in a longest row.

8. The active device array substrate as recited in claim 7, wherein the position of the first connection line formed by the orthogonal projection positions of the first contact holes formed on the substrate and the position of the second connection line formed by the orthogonal projection positions of the second contact holes formed on the substrate are two parallel lines.

9. The active device array substrate as recited in claim 1, wherein the selection lines comprise a plurality of first selection lines and a plurality of second selection lines, each of the first selection lines and each of the second selection lines are located between the two adjacent second signal lines, and a number of the pixel units in a longest column is greater than a number of the pixel units in a longest row.

10. A display panel comprising:
a display panel body having a first surface, a second surface opposite to the first surface, and a first through hole passing through the display panel body and connecting the first surface and the second surface, wherein the display panel body comprises the active device array substrate as claimed in claim 1;
a first protective film arranged on the first surface, the first protective film having a second through hole connected to the first through hole;
a second protective film arranged on the second surface; and
a sealant filling the first through hole, so as to seal a sidewall of the display panel body exposed by the first through hole, a material of the sealant being a curable material.

11. The display panel as recited in claim 10, wherein a width of the second through hole is smaller than a width of the first through hole.

12. The display panel as recited in claim 10, wherein a width of the second through hole is equal to a width of the first through hole.

13. The display panel as recited in claim 10, wherein the curable material comprises epoxy resin, ultraviolet curing adhesive, or thermal-setting adhesive.

14. The display panel as recited in claim 10, wherein the second protective film has a third through hole, the sealant has a fourth through hole, and the fourth through hole is connected between the second through hole and the third through hole.

15. The display panel as recited in claim 14, wherein a sidewall of the first protective film exposed by the second through hole, a sidewall of the sealant exposed by the fourth through hole, and a sidewall of the second protective film exposed by the third through hole constitute a continuous surface.

16. The display panel as recited in claim 15, wherein a width of the second through hole, a width of the third through hole, and a width of the fourth through hole are identical.

17. The display panel as recited in claim 15, wherein a width of the second through hole, a width of the third through hole, and a width of the fourth through hole gradually decrease in a direction perpendicular to the display panel, the width of the fourth through hole and the width of the second through hole are identical at an intersection of the sealant and the first protective film, and the width of the fourth through hole and the width of the third through hole are identical at an intersection of the sealant and the second protective film.

18. The display panel as recited in claim 10, wherein the second protective film has a third through hole, the sealant further seals the sidewall of the first protective film exposed by the second through hole, and the sealant has a fourth through hole connected to the third through hole.

19. The display panel as recited in claim 18, wherein a sidewall of the sealant exposed by the fourth through hole and a sidewall of the second protective film exposed by the third through hole constitute a continuous surface.

20. The display panel as recited in claim 19, wherein a width of the third through hole and a width of the fourth through hole are identical.

21. The display panel as recited in claim 19, wherein a width of the third through hole and a width of the fourth through hole gradually decrease in a direction perpendicular to the display panel, and the width of the fourth through hole and the width of the third through hole are identical at an intersection of the sealant and the second protective film.

22. A display panel comprising:
the active device array substrate as claimed in claim 1;
an electrophoretic display film disposed on the active device array substrate and having a first via, wherein the first via is communicated with the through hole so as to define a first through hole, and the sealant extends and fills the first through hole so as to seal side sidewalls of the active device array substrate and the electrophoretic display film;
a first protective film disposed on the active device array substrate and having a second through hole, wherein the active device array substrate is located between the first protective film and the electrophoretic display film, the second through hole is communicated with the first through hole; and
a second protective film disposed on the electrophoretic display film, wherein the electrophoretic display film is located between the second protective film and the active device array substrate.

23. The display panel as recited in claim 22, wherein a width of the second through hole is equal to or smaller than a width of the first through hole.

24. The display panel as recited in claim 22, wherein the second protective film has a third through hole, the sealant has a fourth through hole, and the fourth through hole is communicated with the first through hole, the second through hole and the third through hole.

25. The display panel as recited in claim 24, wherein a sidewall of the first protective film exposed by the second through hole, a sidewall of the sealant exposed by the fourth through hole, and a sidewall of the second protective film exposed by the third through hole constitute a continuous surface.

* * * * *